(12) United States Patent  
Matsui et al.

(10) Patent No.: US 8,951,386 B2
(45) Date of Patent: Feb. 10, 2015

(54) TREATMENT OF SYNTHETIC QUARTZ GLASS SUBSTRATE

(75) Inventors: Harunobu Matsui, Joetsu (JP); Ryouhei Hasegawa, Joetsu (JP); Masaki Takeuchi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/162,790

(22) Filed: Jun. 17, 2011

(65) Prior Publication Data

US 2011/0308737 A1 Dec. 22, 2011

(30) Foreign Application Priority Data

Jun. 18, 2010 (JP) ................. 2010-139052

(51) Int. Cl.
- *B32B 38/10* (2006.01)
- *G03F 7/16* (2006.01)
- *G03F 7/42* (2006.01)
- *H01L 21/00* (2006.01)
- *G03F 1/00* (2012.01)

(52) U.S. Cl.
CPC ............... *G03F 7/168* (2013.01); *G03F 7/422* (2013.01); *B32B 38/10* (2013.01); *H01L 21/00* (2013.01); *G03F 1/14* (2013.01)
USPC ........................................ 156/704

(58) Field of Classification Search
None
See application file for complete search history.

(56) References Cited

U.S. PATENT DOCUMENTS

| | | | |
|---|---|---|---|
| 4,640,719 A | 2/1987 | Hayes et al. | |
| 4,847,182 A | 7/1989 | Worns et al. | |
| 5,098,591 A * | 3/1992 | Stevens | 510/106 |
| 5,783,551 A | 7/1998 | Mirsky | |
| 2004/0079194 A1* | 4/2004 | Nakata et al. | 75/255 |
| 2008/0286680 A1* | 11/2008 | Norikane et al. | 430/110.4 |
| 2008/0316896 A1* | 12/2008 | Usami | 369/103 |
| 2010/0086879 A1* | 4/2010 | Takayama et al. | 430/325 |

FOREIGN PATENT DOCUMENTS

WO  WO 2007/138747 A1  12/2007

OTHER PUBLICATIONS

European Search Report issued Nov. 4, 2011, in European Patent Application No. 11170116.5.

* cited by examiner

*Primary Examiner* — Mark A Osele
*Assistant Examiner* — Nickolas Harm
(74) *Attorney, Agent, or Firm* — Birch, Stewart, Kolasch & Birch, LLP.

(57) ABSTRACT

A synthetic quartz glass substrate having a resist film coated thereon is treated by immersing it in a terpene-containing solvent until the resist film is released, and rinsing the substrate with water.

11 Claims, No Drawings

TREATMENT OF SYNTHETIC QUARTZ GLASS SUBSTRATE

CROSS-REFERENCE TO RELATED APPLICATION

This non-provisional application claims priority under 35 U.S.C. §119(a) on Patent Application No. 2010-139052 filed in Japan on Jun. 18, 2010, the entire contents of which are hereby incorporated by reference.

TECHNICAL FIELD

This invention relates to a synthetic quartz glass substrate which is coated with a resist film and an optional protective film. More particularly, it relates to a method for removing the resist film and the optional protective film from the substrate by releasing rather than dissolving in solvents.

BACKGROUND ART

In the semiconductor photomask and nano-imprint lithography, complete removal of resist and other films from the substrate is required in order to form a low defective, finer pattern. During the process, a synthetic quartz glass substrate having a pattern-transferring thin film is used after a resist film and an optional protective film are formed thereon. The resist film and protective film must be completely removed from the substrate so that no residues may be left on the substrate.

In the prior art, from a substrate having resist and protective films coated thereon, the films are removed by dissolution using a suitable solvent containing a reagent capable of dissolving film components. When the substrate is pulled out of the solvent, the solvent having organic matter dissolved therein is carried over on the substrate surface, leaving the risk of secondary contamination.

It is then contemplated to peel the film from the substrate surface rather than dissolving the film on the substrate in a solvent. The method of peeling a resist film using ozone water is proposed. For example, WO 2007/138747 describes a method of peeling a resist film from a mask blank by treatment with ozone water having a certain ozone concentration.

This method, however, takes a long time until the resist film is peeled from the substrate. Because of the problem of increased process time, the method is industrially unacceptable at the present. For treatment with ozone water having a high ozone concentration, an intensified ozone generator and associated equipment to be installed therefor increase the capital investment. This leads to the increased production cost which is reflected by the price of products, which is unwanted to both the supply and demand sides.

CITATION LIST

Patent Document 1: WO 2007/138747

SUMMARY OF INVENTION

For removing an organic matter-based film from a substrate, the prior art approach is to dissolve the film as discussed above. An object of the invention is to provide a method for removing a film on a synthetic quartz glass substrate by peeling the film from the substrate rather than dissolving, with the advantages of precise treatment, a short tact time, and eliminated secondary contamination.

The inventors have found that when a synthetic quartz glass substrate which is coated with a resist film and an optional protective film is immersed and oscillated in a terpene-containing solvent, cracks immediately form in the film(s) on the substrate so that the film(s) may be shortly and readily released. By further rinsing the substrate with water, any residues may be completely removed. The method may be easily incorporated in the semiconductor manufacturing process utilizing photomask or nano-imprint lithography.

The invention provides a method for treating a synthetic quartz glass substrate having a resist film coated thereon, comprising the steps of immersing the coated substrate in a solvent having a terpene dissolved therein until the resist film is substantially released or peeled, and rinsing the substrate with water.

Most often the terpene is limonene. The resist film is composed mainly of a polynorbornene resin, polyhydroxystyrene resin, or novolac resin.

The substrate may further have a protective film coated on the resist film. Typically the protective film is composed mainly of rosin and/or derivatives thereof.

Advantageous Effects of Invention

The method can completely remove a resist film from a substrate as used in the semiconductor photomask and nano-imprint lithography. Even when the resist film is overlaid with a protective film, the films can be simultaneously removed. Since the resist and protective films are released or peeled instead of dissolving organic components of the resist and protective films in solvents, the unnecessary film components can be readily recovered, and the solvent for film release can be used for a long period of time. The ability to remove the resist and protective films and the tact time taken for film removal are improved.

DESCRIPTION OF EMBODIMENTS

The method of the invention is to treat a synthetic quartz glass substrate which has been coated with a resist film and optionally further with a protective film on the resist film. A choice may be made of those substrates used in the semiconductor photomask and nano-imprint technology.

The size of substrate may be properly selected. Since the substrate is immersed and oscillated in a solvent, a substrate having one surface with an area of 100 to 100,000 mm$^2$, more preferably 100 to 50,000 mm$^2$ is preferred when the weight of the substrate itself and the size of a tank for accommodating the substrate are taken into account. Typical are square 6025 substrates (152 mm×152 mm×6.35 mm thick) as often used in the semiconductor photomask and circular wafers such as 6-inch and 8-inch diameter wafers.

The resist film which is formed on the glass substrate and is to be released therefrom is composed mainly of polynorbornene resins and polyhydroxystyrene resins which are the base resin in resist compositions for excimer laser lithography, or novolac resins which are the base resin in resist composition for i- and g-line lithography, for example. These resins are preferred since they have C=C double bonds in their structure and are likely to interact with terpenes. The resist film may be formed on the glass substrate by coating a resist composition and heat treating for baking. The film thickness, bake temperature and time may be properly selected depending on the type of resist composition.

The protective film serves to protect not only the glass substrate, but also the resist film. The protective film is composed mainly of rosin and derivatives thereof, for example.

Rosin is based on abietic and other resin acids having a melting point of approximately 50° C. Even when the presence of additional substances is taken into account, the wax may be dissolved at about 70° C., which indicates minimized thermal damage to the substrate. Since solid wax composed mainly of rosin and isomers thereof softens under relatively mild temperature conditions and is readily applicable to form a thick film on the substrate, a protective film of solid wax is preferred. A rosin composed mainly of abietic and pimaric acids is more preferred because of ease of interaction with terpenes. Examples of rosin are commercially available under the trade name of Skywax, Shiftwax, Alcowax and Aquawax series from Nikka Seiko Co., Ltd.

In a preferred embodiment, the glass substrate having a resist film and an optional protective film coated thereon is held by a jig, typically basket, whereupon it is quickly immersed in a terpene-containing solvent.

Upon contact with terpenes, the resist or protective film is released. The terpenes may be used alone or in admixture of two or more. Inter alia, monoterpenes are preferred for ease of interaction with the resist and protective films. Of the monoterpenes, d-limonene, l-limonene, and d/l-limonene are more preferred from the standpoints of minimizing the environmental load and substrate damage.

On use, the terpenes are dissolved in organic solvents including alcohols such as methanol and ethanol, ketones such as acetone and methyl ethyl ketone, aromatic solvents such as toluene and xylene, and glycol ethers such as ethylene glycol. Preferably the terpene is dissolved in the solvent in a concentration of 30 to 80% by weight, more preferably 50 to 80% by weight. A solution having a terpene concentration of less than 30 wt % may be insufficient to release the resist film from the substrate whereas a solution having a terpene concentration of more than 80 wt % may be unfavorable from the safety aspect.

Once the coated substrate is immersed in the terpene solution, it is oscillated therein until the resist film is released from the substrate surface. Oscillation may be done simply by manually swinging the substrate-holding jig in the organic solvent, but preferably by actuating a mechanical oscillator in a controlled manner. The mechanical control of oscillation has the advantages that the time taken for the resist film to be released may be controlled, rough release action may be facilitated evenly throughout the film, and therefore, the tact time of the overall process is manageable. The treatment with terpene solution is preferably continued at a temperature of 15 to 50° C., more preferably 30 to 50° C. until the resist film is released.

The method of removing the resist film from the substrate (to which the resist film is adhered) by releasing rather than dissolving the film is advantageous from the aspect of secondary contamination. In a preferred mechanism, cracks form in the resist film during immersion. Then the terpene-containing solvent may penetrate through such cracks to the interface between the substrate and the resist film. The time taken for releasing the resist film from the substrate is shortened. This is advantageous than the case wherein the resist film is released or peeled as an independent film.

Once the resist film is roughly released from the substrate, the substrate is rinsed with water. Specifically the substrate is taken out of the bath, fully freed of the liquid, and immersed in a water tank where it is oscillated. Oscillation may be done by the same technique as in the organic solvent bath. Release of any residual resist film may be promoted by applying external stimulation such as sonication to such an extent as to cause no damage to the substrate. This is preferred because the tact time can be further shortened. If minute defects of the order of several tens of nanometers on the substrate surface are regarded significant, water rinsing is preferably carried out using a water shower or similar mechanism by which water is shed over the substrate because such mechanims causes little or no flaws to the substrate. Rinse water is preferably at a temperature of 10 to 70° C., more preferably 10 to 50° C. for ease of handling.

EXAMPLE

Examples of the invention are given below by way of illustration and not by way of limitation.

Example 1

A synthetic quartz glass substrate of 6 inches was prepared by polishing the substrate surface to a mirror finish. On the substrate surface, a novolac resin-based resist composition for i-line lithography (AZP1350 by AZ Electronic Materials) was coated and baked at a temperature of 120° C. for 5 minutes to form a resist film of 1 Km thick.

A solid wax composed mainly of abietic acid (Shiftwax by Nikka Seiko Co., Ltd.) was dissolved at 70° C. and applied onto the resist film on the substrate to form a protective film of 5 μm thick.

The coated substrate was quickly immersed in an ethylene glycol bath of 60 wt % d-limonene and manually swung therein. Immediately after immersion, cracks formed in the resist and wax films, and the films started peeling. At the time of 180 seconds after immersion, the resist and wax films released from the substrate over an area of about 90% of the substrate surface area.

The substrate was taken out of the d-limonene/ethylene glycol bath, fully freed of the liquid, and immersed in a water tank where it was rinsed with water for 180 seconds under sonication at 28 kHz. The portions of the resist and wax films which had not been removed in the d-limonene/ethylene glycol bath were fully released in the water tank, resulting in the quartz glass substrate which was identical with the reference state prior to resist baking.

The complete removal of the resist film from the substrate surface was confirmed by elemental analysis of the substrate surface by the FT-IR spectroscopy ATR method, where organic substances such as phenol of which the novolac resin was mainly composed were not detected.

Since the resist and wax films which were released in the d-limonene/organic solvent bath were present as solids in the liquid, they could be readily recovered using a net. Since components of the resist and wax films were not dissolved in the organic solvent bath, the bath life could be prolonged.

Comparative Example 1

A substrate having resist and wax films coated thereon was prepared as in Example 1. The coated substrate was quickly immersed in an organic solvent bath composed mainly of hydrofluoroether (HFE-7100 by 3M-Sumitomo Co., Ltd.) and manually swung therein. Once the substrate was immersed, the resist and wax films started dissolving in the organic solvent. At the time of 300 seconds after immersion, it was visually seen under fluorescent lamps that the resist and wax films were dissolved in the solvent.

Thereafter, the substrate was taken out of the bath, and transferred to another organic solvent bath composed mainly of hydrofluoroether where it was rinsed for 180 seconds.

On elemental analysis of the substrate surface by the FT-IR spectroscopy ATR method, spectral peaks attributable to C═C stretching vibration of phenol of which the novolac resin was mainly composed were detected.

Since components of the resist and wax films were fully dissolved in the organic solvent, they could not be recovered.

Comparative Example 2

A substrate having resist and wax films coated thereon was prepared as in Example 1 except that polyhydroxystyrene was used as the resist resin. The coated substrate was quickly immersed in an isopropyl alcohol (IPA) bath and manually swung therein. Once the substrate was immersed, the resist and wax films started dissolving in the IPA. At the time of 600 seconds after immersion, it was visually seen under fluorescent lamps that the resist and wax films were dissolved in the IPA.

Thereafter, the substrate was taken out of the IPA bath and transferred to a water tank where it was rinsed with water for 180 seconds under sonication at 28 kHz.

On elemental analysis of the substrate surface by the FT-IR spectroscopy ATR method, spectral peaks attributable to C═C stretching vibration of aromatic ring of which the polyhydroxystyrene resin was mainly composed were detected. On visual observation under light irradiation, a haze was found on the substrate, indicating that the resist and protective films were not completely removed.

Since components of the resist and wax films were fully dissolved in the IPA as in Comparative Example 1, they could not be recovered.

Japanese Patent Application No. 2010-139052 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for treating a synthetic quartz glass substrate to remove a resist film formed on the glass substrate by coating a resist composition and heat treating for baking, comprising the steps of:
   immersing the coated substrate in a solvent selected from the group consisting of toluene, xylene, and ethylene glycol having a terpene dissolved therein to release the resist film from the surface of the coated substrate,
   releasing the resist film from the surface of the coated substrate without dissolving the resist film, and
   rinsing the substrate with water.

2. The method of claim 1, wherein the substrate further has a protective film coated on the resist film.

3. The method of claim 2 wherein the protective film is composed mainly of at least one component selected from rosin and derivatives thereof.

4. The method of claim 1 wherein the terpene is a monoterpene.

5. The method of claim 4 wherein the terpene is limonene.

6. The method of claim 1 wherein the resist film is composed mainly of a component selected from the group consisting of a polynorbornene resin, polyhydroxystyrene resin, and novolac resin.

7. The method of claim 1 wherein the terpene is used in the solvent in a concentration of 30 to 80% by weight.

8. The method of claim 7 wherein the terpene is used in the solvent in a concentration of 50 to 80% by weight.

9. The method of claim 1 wherein as the substrate is rinsed with water, the substrate is sonicated.

10. The method of claim 1, further comprising oscillating the coated substrate in the solvent having the terpene dissolved therein.

11. The method of claim 1, wherein the resist film is composed mainly of a component selected from the group consisting of a polynorbornene resin and polyhydroxystyrene resin.

* * * * *